(12) United States Patent
Zhao

(10) Patent No.: US 9,536,911 B2
(45) Date of Patent: Jan. 3, 2017

(54) ASSEMBLING METHOD FOR ARRAY SUBSTRATE AND COLOR FILTER SUBSTRATE OF LIQUID CRYSTAL DISPLAY

(71) Applicant: Shenzhen China Star Optoelectronics Technology Co., Ltd., Shenzhen, Guangdong (CN)

(72) Inventor: Guo Zhao, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 176 days.

(21) Appl. No.: 14/127,487

(22) PCT Filed: Sep. 29, 2013

(86) PCT No.: PCT/CN2013/084628
§ 371 (c)(1),
(2) Date: Dec. 18, 2013

(87) PCT Pub. No.: WO2015/042921
PCT Pub. Date: Apr. 2, 2015

(65) Prior Publication Data
US 2015/0179685 A1     Jun. 25, 2015

(30) Foreign Application Priority Data
Sep. 24, 2013 (CN) .......................... 2013 1 0437710

(51) Int. Cl.
H01L 27/12 (2006.01)
G02F 1/1339 (2006.01)
(Continued)

(52) U.S. Cl.
CPC ......... H01L 27/1262 (2013.01); G02F 1/1339 (2013.01); G02F 1/1341 (2013.01);
(Continued)

(58) Field of Classification Search
CPC .......................... G02F 1/1341; H01L 27/1262
See application file for complete search history.

(56) References Cited

U.S. PATENT DOCUMENTS

2002/0043344 A1* 4/2002 Watanabe ........... B32B 38/1841
156/583.4
2002/0196393 A1* 12/2002 Tashiro ................. G02F 1/1303
349/106
(Continued)

*Primary Examiner* — Jaehwan Oh
(74) *Attorney, Agent, or Firm* — Andrew C. Cheng

(57) ABSTRACT

The present invention discloses an assembling method for array substrate and color filter substrate of liquid crystal display, which comprises: coating a seal on a color filter substrate; forming multiple sealing points at the predetermined position between an array substrate with liquid crystal and the color filter substrate; rotating the color filter substrate to fit the array substrate; irradiating the sealing points using a light source to cure the sealing points, so that the array substrate and the color filter substrate are bonded. According to the embodiment of the present invention, it can be aligned precisely during assembling process of the array substrate and the color filter substrate, which avoids the poor substrate alignment caused by handling or flip and then improves the product yield.

16 Claims, 3 Drawing Sheets

(51) Int. Cl.
*G02F 1/1333* (2006.01)
*G02F 1/1341* (2006.01)

(52) U.S. Cl.
CPC .............. *G02F 1/133351* (2013.01); *G02F 2001/133354* (2013.01)

(56) References Cited

U.S. PATENT DOCUMENTS

| | | | | |
|---|---|---|---|---|
| 2003/0043337 A1* | 3/2003 | Takabayashi | ......... | G02F 1/1333 349/187 |
| 2003/0117570 A1* | 6/2003 | Kim | .................... | G02F 1/13394 349/153 |
| 2004/0001177 A1* | 1/2004 | Byun | .................... | G02F 1/1339 349/187 |
| 2004/0105065 A1* | 6/2004 | Jung | .................... | G02F 1/1341 349/153 |
| 2004/0188653 A1* | 9/2004 | Kataoka | .................. | C09K 19/14 252/299.01 |
| 2004/0226652 A1* | 11/2004 | Murata | .................. | G02F 1/1341 156/292 |
| 2005/0068488 A1* | 3/2005 | Tajima | .................. | G02F 1/1339 349/190 |
| 2007/0091246 A1* | 4/2007 | Sugimoto | ............. | G02F 1/1341 349/153 |
| 2009/0122244 A1* | 5/2009 | Motomatsu | ........... | G02F 1/1341 349/122 |
| 2010/0079718 A1* | 4/2010 | Sekiya | .............. | G02F 1/133512 349/153 |
| 2013/0250217 A1* | 9/2013 | Ma | ........................ | G02F 1/1339 349/106 |
| 2013/0271706 A1* | 10/2013 | Taguchi | ................ | G02F 1/1339 349/106 |
| 2013/0288411 A1* | 10/2013 | Yu | ........................ | G02F 1/1303 438/30 |

* cited by examiner

ASSEMBLING METHOD FOR ARRAY SUBSTRATE AND COLOR FILTER SUBSTRATE OF LIQUID CRYSTAL DISPLAY

This application claims priority to Chinese Patent Application Serial No. 201310437710.6, named as "assembling method for array substrate and color filter substrate of liquid crystal display", filed on Sep. 24, 2013, the specification of which is incorporated herein by reference.

BACKGROUND OF THE INVENTION

1. Field of the Invention

The present invention relates to the assembling technology of thin film transistor liquid crystal display (TFT-LCD), and in particular to an assembling method for array substrate and color filter substrate of liquid crystal display.

2. The Related Arts

The assembling of the array substrate (TFT substrate) and the color filter substrate (CF substrate) of the liquid crystal display is shown in FIG. 1. From the figure, during the assembling of the array substrate (TFT substrate) and the color filter substrate (CF substrate) among the manufacturing techniques of the current liquid crystal display panel, firstly seal 60 and Au are coated on the color filter substrate, then the liquid crystal 70 is dropped on the array substrate 7, and subsequently both of the substrate are fitted to form a liquid crystal cell. Before the fitting process, it can pre-align through a pre-assembly mark and then finely align through a fine assembly mark. The corresponding assembled substrates are rotated and transferred for the seal UV curing by robot hand.

During the transferring and rotating process, the optimally aligned TFT substrate and CF substrate will be shifted and slightly rotated because the seal has not been cured by infrared light and do not have bonding effect, leading to poor substrate alignment. Hence, light leakage will be normally occurred on the LCD with the substrates, which decreases the grade or the optical contrast.

SUMMARY OF THE INVENTION

The technical issue to be solved by the present invention is to provide a assembling method for array substrate and color filter substrate of liquid crystal display, which can be aligned precisely during assembling process of the array substrate and the color filter substrate, which avoids the poor substrate alignment caused by handling or flip and then improves the product yield.

In order to solve the technical issue, the embodiment according to the present invention provides an assembling method for array substrate and color filter substrate of liquid crystal display, which comprises:
coating a seal on a color filter substrate;
forming multiple sealing points at the predetermined position between an array substrate with liquid crystal and the color filter substrate;
rotating the color filter substrate to fit the array substrate;
irradiating the sealing points using a light source to cure the sealing points, so that the array substrate and the color filter substrate are bonded.
Wherein, the specific step of coating a seal on a color filter substrate is:
coating multiple main seals, a secondary seal and a circular seal on the color filter substrate, wherein, the multiple main seals are arranged in array, the secondary seal is provided outside a certain amount of the main seals, and the circular seal is provided surrounding the secondary seal.

Wherein, the specific step of forming multiple sealing points at the predetermined position between an array substrate with liquid crystal and the color filter substrate is:
coating the multiple sealing points at the edge of the array substrate; or/and coating the multiple sealing points at the edge of the color filter substrate or the area of the secondary seal.

Wherein, the specific step of forming multiple sealing points at the predetermined position between an array substrate with liquid crystal and the color filter substrate is:
coating the multiple sealing points at the edge of the pre-assembly mark or/and the fine assembly mark of the array substrate; or
coating the multiple sealing points on the pattern lines of the pre-assembly mark or/and the fine assembly mark of the array substrate.

Wherein, the size of the coated sealing point is smaller than the width of the pattern line thereon.

Wherein, the specific step of forming multiple sealing points at the predetermined position between an array substrate with liquid crystal and the color filter substrate is:
defining the multiple regions of the multiple main seals, the secondary seal and the circular seal as the sealing points.

Wherein, the specific step of irradiating the sealing points using a light source to cure the sealing points, so that the array substrate and the color filter substrate are bonded, is:
using a miniature UV light source or a CCD light source to irradiate the sealing points, so that the sealing points are cured and the color filter substrate is bonded with the array substrate.

Wherein, the components of the sealing points at least comprise an oligomer, a photoinitiator, and a thermal curing agent.

Wherein, it further comprises:
transporting the liquid crystal cell formed after the color filter substrate bonded with the array substrate to a seal UV curing equipment, so that the seal coated on the color filter substrate is cured.

The embodiment according to the present invention further provides an assembling method for array substrate and color filter substrate of liquid crystal display, which comprises:
coating multiple main seals, a secondary seal and a circular seal on the color filter substrate, wherein, the multiple main seals are arranged in array, the secondary seal is provided outside a certain amount of the main seals, and the circular seal is provided surrounding the secondary seal;
forming multiple sealing points at the predetermined position between an array substrate with liquid crystal and the color filter substrate, the components of the sealing points at least comprising an oligomer, a photoinitiator, and a thermal curing agent;
rotating the color filter substrate to fit the array substrate;
irradiating the sealing points using a light source to cure the sealing points, so that the array substrate and the color filter substrate are bonded.

Wherein, the specific step of forming multiple sealing points at the predetermined position between an array substrate with liquid crystal and the color filter substrate is:
coating the multiple sealing points at the edge of the array substrate; or/and
coating the multiple sealing points at the edge of the color filter substrate or the area of the secondary seal.

Wherein, the specific step of forming multiple sealing points at the predetermined position between an array substrate with liquid crystal and the color filter substrate is:
coating the multiple sealing points at the edge of the pre-assembly mark or/and the fine assembly mark of the array substrate; or
coating the multiple sealing points on the pattern lines of the pre-assembly mark or/and the fine assembly mark of the array substrate.

Wherein, the size of the coated sealing point is smaller than the width of the pattern line thereon.

Wherein, the specific step of forming multiple sealing points at the predetermined position between an array substrate with liquid crystal and the color filter substrate is:
defining the multiple regions of the multiple main seals, the secondary seal and the circular seal as the sealing points.

Wherein, it further comprises:
transporting the liquid crystal cell formed after the color filter substrate bonded with the array substrate to a seal UV curing equipment, so that the seal coated on the color filter substrate is cured.

Wherein, the specific step of irradiating the sealing points using a light source to cure the sealing points, so that the array substrate and the color filter substrate are bonded, is:
using a miniature UV light source or a CCD light source to irradiate the sealing points, so that the sealing points are cured and the color filter substrate is bonded with the array substrate.

The embodiment of the present invention has the beneficial effects as follow. It provides the multiple sealing points when the array substrate assembling with the color filter substrate and then cure the sealing points through irradiation, so that the array substrate and the color filter substrate are bonded after assembling, which improves the assembling precision for the array substrate and the color filter substrate, avoids the poor substrate alignment caused by handling or flip, and then improves the product yield.

BRIEF DESCRIPTION OF THE DRAWINGS

In order to more clearly illustrate the embodiment of the present invention or the technical issue of the prior art, the accompanying drawings and the detailed descriptions are as follows. Obviously, the following description of the accompanying drawings are only some embodiments according to the present invention, for persons of ordinary skill in this field, they can also obtain other drawings based on these drawings without creative effort.

DETAILED DESCRIPTION OF THE PREFERRED EMBODIMENTS

Figure 1:
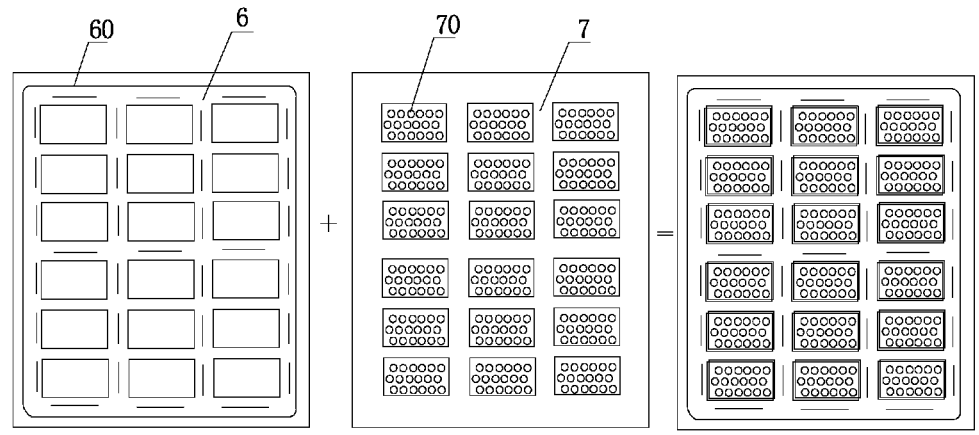
FIG. 1 is a schematic view illustrating an assembling for array substrate and color filter substrate of liquid crystal display according to the prior art.
Figure 2:
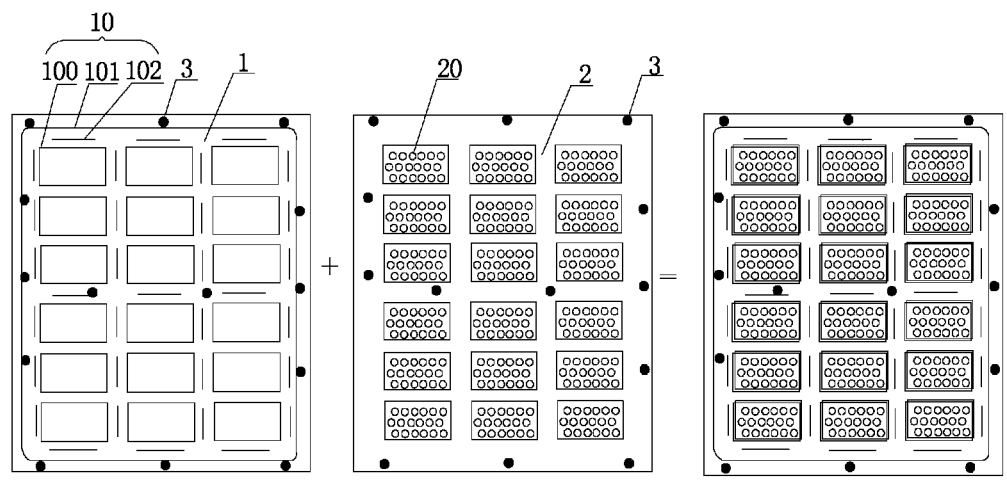
FIG. 2 is a schematic view illustrating the assembling method for array substrate and color filter substrate of liquid crystal display according to an embodiment of the present invention.

The detailed descriptions accompanying drawings and the preferred embodiment of the present invention are as follows. Referring to FIG. 2, it shows a schematic view illustrating the assembling method for array substrate and color filter substrate of liquid crystal display according to an embodiment of the present invention. In the embodiment, the assembling method for array substrate and color filter substrate of liquid crystal display comprises the steps as follows.

Step 1, coating a seal 10 on a color filter substrate 1 and a gold point (not shown). Specifically, coat multiple main seals 100, a secondary seal 102 and a circular seal 101 on the color filter substrate 1. Wherein, the multiple main seals 100 are arranged in array, the secondary seal 102 is provided outside a certain amount, which is 3 in Figure, of the main seals 100, and the circular seal 101 is provided surrounding the secondary seal 102. At the same time, it also spreads the spacers.

Step 2, injecting a liquid crystal 20 on an array substrate 2.

Step 3, forming multiple sealing points 3 at the predetermined position between the array substrate 2 with the liquid crystal 20 and the color filter substrate 1. The specific step of forming multiple sealing points 3 is: coating the multiple sealing points 3 at the edge of the array substrate 2, or/and coating the multiple sealing points 3 at the edge of the color filter substrate 1 or/and the area of the secondary seal 102. Wherein, the components of the sealing points 3 at least comprise an oligomer, a photoinitiator, a thermal curing agent, an additive, a filler, etc.

Step 4, rotating the color filter substrate 1 coated with the seal 10 to fit the array substrate 2. It can pre-align through a pre-assembly mark and then finely align through a fine assembly mark.

Step 5, irradiating the sealing points 3 using a light source to cure the sealing points 3, so that the array substrate 2 and the color filter substrate 1 are bonded. Wherein, the light source can be miniature UV light source or a CCD light source. By irradiating the light source to each sealing points 3, the sealing points 3 are cured and the color filter substrate 1 is assembled with the array substrate 2. Wherein, the CCD light source can be the specific used for the charge-couple device (CCD) of the microscope camera, such as a circular light-emitting diode (LED) source. To achieve the purpose of curing the sealing points, the CCD light source preferably needs to be a white light source covering the whole band or a blue light source near UV band.

After that, transport the liquid crystal cell formed after the color filter substrate 1 bonded with the array substrate 2 to a seal UV curing equipment. Through ultraviolet light irradiation and heat treatment, the oligomer and the thermal curing agent in the seal 10 will undergo polymerization under the action of a photoinitiator, so that the seal 10 coated on the color filter substrate 1 is cured.

Figure 3:
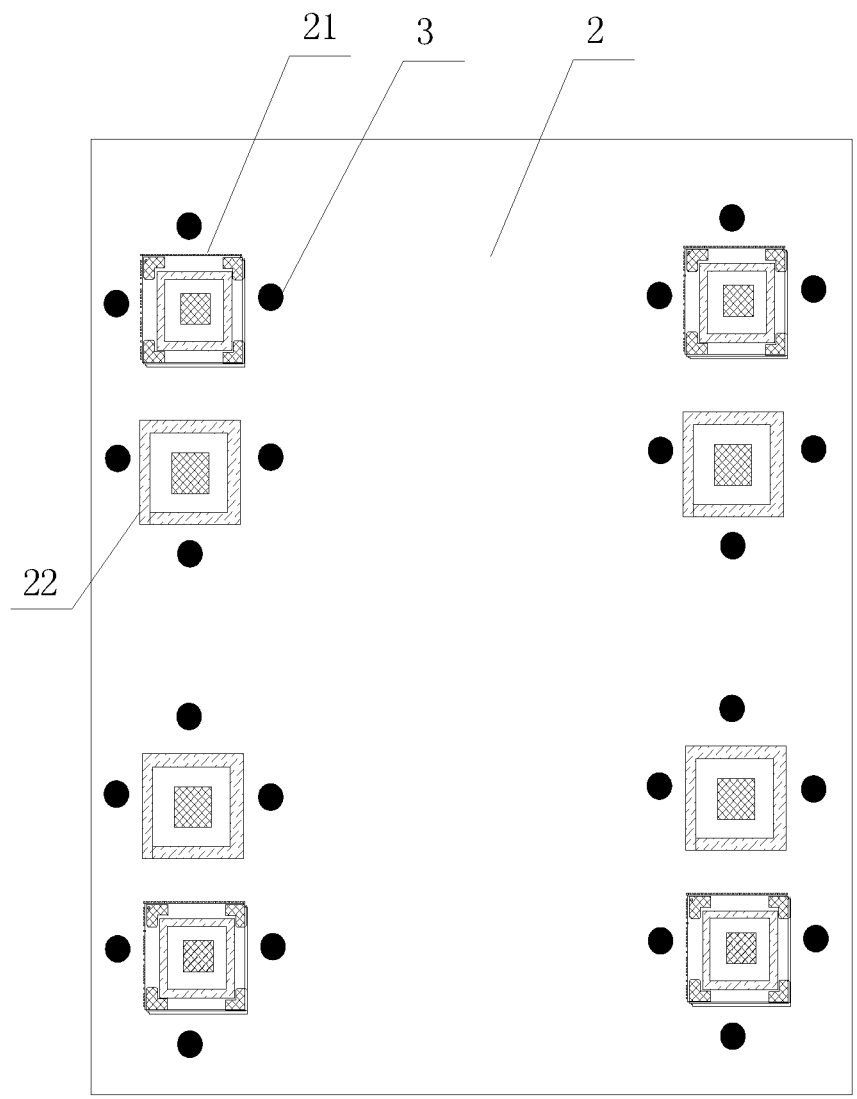
FIG. 3 is a schematic view illustrating providing the sealing points in the assembling method for array substrate and color filter substrate of liquid crystal display according to another embodiment of the present invention.

FIG. 3 is a schematic view illustrating providing the sealing points in the assembling method for array substrate and color filter substrate of liquid crystal display according to another embodiment of the present invention. In the embodiment, the difference between the flow of the assembling method for array substrate and color filter substrate of liquid crystal display and that shown in FIG. 2 is the step 2 of forming multiple sealing points 3 at the predetermined position between the array substrate 2 with liquid crystal and the color filter substrate 1. In the present embodiment, it coats the multiple sealing points 3 at the edge of the pre-assembly mark 21 or/and the finely assembly mark 22 of the array substrate.

Similarly, it needs to irradiate the sealing points 3 using a miniature UV light source or a CCD light source after the alignment of the array substrate 2 and the color filter substrate 1.

The other processes and the principle is the same as the embodiment shown in FIG. 2, which is not repeated here.

Figure 4:
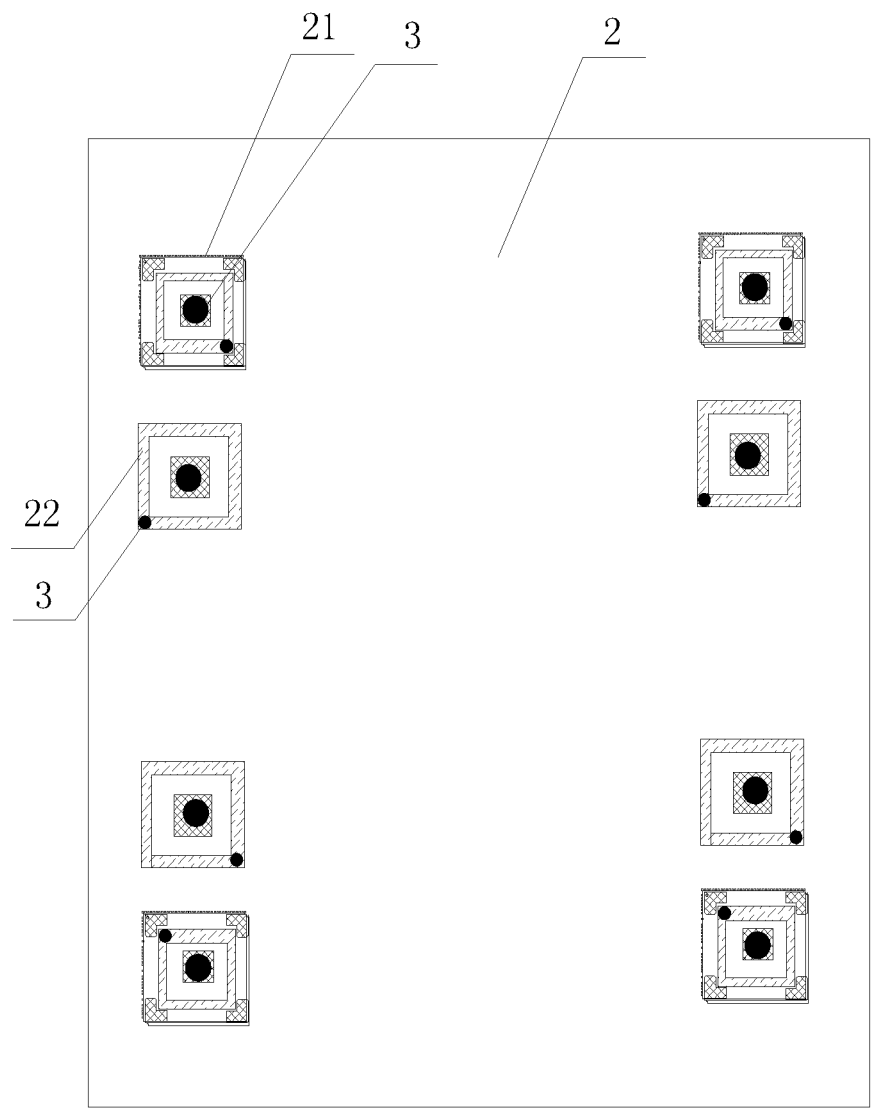
FIG. 4 is a schematic view illustrating providing the sealing points in the assembling method for array substrate and color filter substrate of liquid crystal display according to a further embodiment of the present invention.

FIG. 4 is a schematic view illustrating providing the sealing points in the assembling method for array substrate and color filter substrate of liquid crystal display according to a further embodiment of the present invention. In the embodiment, the difference between the flow of the assembling method for array substrate and color filter substrate of liquid crystal display and that shown in FIG. 2 is the step 2 of forming multiple sealing points 3 at the predetermined position between the array substrate 2 with liquid crystal and the color filter substrate 1. In the present embodiment, it coats the multiple sealing points 3 on the pattern lines of the pre-assembly mark 21 or/and the finely assembly mark 22 of the array substrate. Wherein, the size of the coated sealing point 3 is smaller than the width of the pattern line thereon, which won't affect the assembling precision of the array substrate 2 and the color filter substrate 1.

Similarly, it needs to irradiate the sealing points 3 using a miniature UV light source or a CCD light source after the alignment of the array substrate 2 and the color filter substrate 1.

The other processes and the principle is the same as the embodiment shown in FIG. 2, which is not repeated here.

In another embodiment of the present invention, the specific step of forming multiple sealing points at the predetermined position between the array substrate 2 with liquid crystal and the color filter substrate 1 in step 2 is: defining the multiple regions of the multiple main seals 100, the secondary seal 102 and the circular seal 101 as the sealing points without additional sealing points in other places.

And then irradiate the light source to each region defined as the sealing points in step 5, so that the multiple regions of the seals are cured. Then, the array substrate 2 can also be bonded to the color filter substrate 1.

The embodiment of the present invention has the beneficial effects as follow. It provides the multiple sealing points when the array substrate assembling with the color filter substrate and then cure the sealing points through irradiation, so that the array substrate and the color filter substrate are bonded after assembling, which improves the assembling precision for the array substrate and the color filter substrate, avoids the poor substrate alignment caused by handling or flip, and then improves the product yield.

The preferred embodiments according to the present invention are mentioned above, which cannot be used to define the scope of the right of the present invention. Those modifications and variations are considered encompassed in the scope of protection defined by the clams of the present invention.

What is claimed is:

1. An assembling method for array substrate and color filter substrate of liquid crystal display, which comprises:
   coating a seal on a color filter substrate;
   forming multiple sealing points at a predetermined position between an array substrate with liquid crystal and the color filter substrate;
   rotating the color filter substrate to fit the array substrate;
   irradiating the sealing points using a light source to cure the sealing points, so that the array substrate and the color filter substrate are bonded;
   wherein the specific step of forming multiple sealing points at the predetermined position between an array substrate with liquid crystal and the color filter substrate is: coating the multiple sealing points at the edge of a pre-assembly mark or/and a fine assembly mark of the array substrate; or coating the multiple sealing points on a pattern lines of the pre-assembly mark or/and the fine assembly mark of the array substrate;
   wherein the size of the coated sealing point is smaller than the width of the pattern line thereon.

2. The assembling method for array substrate and color filter substrate of liquid crystal display as claimed in claim 1, wherein the specific step of coating a seal on a color filter substrate is: coating multiple main seals, a secondary seal and a circular seal on the color filter substrate, wherein, the multiple main seals are arranged in array, the secondary seal is provided outside a certain amount of the main seals, and the circular seal is provided surrounding the secondary seal.

3. The assembling method for array substrate and color filter substrate of liquid crystal display as claimed in claim 1, wherein the specific step of forming multiple sealing points at the predetermined position between an array substrate with liquid crystal and the color filter substrate is: coating the multiple sealing points at the edge of the array substrate; or/and coating the multiple sealing points at the edge of the color filter substrate or the area of the secondary seal.

4. The assembling method for array substrate and color filter substrate of liquid crystal display as claimed in claim 2, wherein the specific step of forming multiple sealing points at the predetermined position between an array substrate with liquid crystal and the color filter substrate is: defining the multiple regions of the multiple main seals, the secondary seal and the circular seal as the sealing points.

5. The assembling method for array substrate and color filter substrate of liquid crystal display as claimed in claim 1, wherein the specific step of irradiating the sealing points using a light source to cure the sealing points, so that the array substrate and the color filter substrate are bonded, is: using a miniature UV light source or a CCD light source to irradiate the sealing points, so that the sealing points are cured and the color filter substrate is bonded with the array substrate.

6. The assembling method for array substrate and color filter substrate of liquid crystal display as claimed in claim 3, wherein the components of the sealing points at least comprise an oligomer, a photoinitiator, and a thermal curing agent.

7. The assembling method for array substrate and color filter substrate of liquid crystal display as claimed in claim 1, wherein the components of the sealing points at least comprise an oligomer, a photoinitiator, and a thermal curing agent.

8. The assembling method for array substrate and color filter substrate of liquid crystal display as claimed in claim 4, wherein the components of the sealing points at least comprise an oligomer, a photoinitiator, and a thermal curing agent.

9. The assembling method for array substrate and color filter substrate of liquid crystal display as claimed in claim 5, wherein it further comprises: transporting the liquid crystal cell formed after the color filter substrate bonded with the array substrate to a seal UV curing equipment, so that the seal coated on the color filter substrate is cured.

10. An assembling method for array substrate and color filter substrate of liquid crystal display, which comprises:

coating multiple main seals, a secondary seal and a circular seal on the color filter substrate, wherein, the multiple main seals are arranged in array, the secondary seal is provided outside a certain amount of the main seals, and the circular seal is provided surrounding the secondary seal;

forming multiple sealing points at a predetermined position between an array substrate with liquid crystal and the color filter substrate, the components of the sealing points at least comprising an oligomer, a photoinitiator, and a thermal curing agent;

rotating the color filter substrate to fit the array substrate;

irradiating the sealing points using a light source to cure the sealing points, so that the array substrate and the color filter substrate are bonded;

wherein the specific step of forming multiple sealing points at the predetermined position between an array substrate with liquid crystal and the color filter substrate is: coating the multiple sealing points at the edge of a pre-assembly mark or/and a fine assembly mark of the array substrate; or coating the multiple sealing points on a pattern lines of the pre-assembly mark or/and the fine assembly mark of the array substrate;

wherein the size of the coated sealing point is smaller than the width of the pattern line thereon.

11. The assembling method for array substrate and color filter substrate of liquid crystal display as claimed in claim 10, wherein the specific step of forming multiple sealing points at the predetermined position between an array substrate with liquid crystal and the color filter substrate is: coating the multiple sealing points at the edge of the array substrate; or/and coating the multiple sealing points at the edge of the color filter substrate or the area of the secondary seal.

12. The assembling method for array substrate and color filter substrate of liquid crystal display as claimed in claim 10, wherein the specific step of forming multiple sealing points at the predetermined position between an array substrate with liquid crystal and the color filter substrate is: defining the multiple regions of the multiple main seals, the secondary seal and the circular seal as the sealing points.

13. The assembling method for array substrate and color filter substrate of liquid crystal display as claimed in claim 11, wherein it further comprises: transporting the liquid crystal cell formed after the color filter substrate bonded with the array substrate to a seal UV curing equipment, so that the seal coated on the color filter substrate is cured.

14. The assembling method for array substrate and color filter substrate of liquid crystal display as claimed in claim 11, wherein the specific step of irradiating the sealing points using a light source to cure the sealing points, so that the array substrate and the color filter substrate are bonded, is: using a miniature UV light source or a CCD light source to irradiate the sealing points, so that the sealing points are cured and the color filter substrate is bonded with the array substrate.

15. The assembling method for array substrate and color filter substrate of liquid crystal display as claimed in claim 9, wherein the specific step of irradiating the sealing points using a light source to cure the sealing points, so that the array substrate and the color filter substrate are bonded, is: using a miniature UV light source or a CCD light source to irradiate the sealing points, so that the sealing points are cured and the color filter substrate is bonded with the array substrate.

16. The assembling method for array substrate and color filter substrate of liquid crystal display as claimed in claim 12, wherein the specific step of irradiating the sealing points using a light source to cure the sealing points, so that the array substrate and the color filter substrate are bonded, is: using a miniature UV light source or a CCD light source to irradiate the sealing points, so that the sealing points are cured and the color filter substrate is bonded with the array substrate.

* * * * *